(12) United States Patent
Achiriloaie et al.

(10) Patent No.: US 8,786,342 B1
(45) Date of Patent: Jul. 22, 2014

(54) GAN HEMT POWER TRANSISTOR PULSE LEVELING CIRCUIT

(75) Inventors: Benone Achiriloaie, Corona, CA (US); Eric C. Hokenson, Long Beach, CA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 2 days.

(21) Appl. No.: 13/563,155

(22) Filed: Jul. 31, 2012

(51) Int. Cl.
*H03K 5/01* (2006.01)

(52) U.S. Cl.
USPC .......................................... 327/165; 327/435

(58) Field of Classification Search
None
See application file for complete search history.

(56) References Cited

U.S. PATENT DOCUMENTS

| 4,435,846 A * | 3/1984 | Weise | 455/234.2 |
| 2009/0316438 A1 * | 12/2009 | Crewson et al. | 363/16 |
| 2011/0279185 A1 * | 11/2011 | Lautzenhiser | 330/296 |

* cited by examiner

*Primary Examiner* — Cassandra Cox
(74) *Attorney, Agent, or Firm* — Christopher P. Maiorana, PC

(57) ABSTRACT

An apparatus comprising an RF circuit, a converter circuit, an amplifier, and a delay circuit. The RF circuit may be configured to generate (i) an output signal and (ii) a first intermediate signal, in response to (i) an input signal and (ii) a control signal. The converter circuit may be configured to generate a second intermediate signal in response to the first intermediate signal. The amplifier may be configured to generate a third intermediate signal in response to the second intermediate signal. The delay circuit may be configured to generate the control signal in response to the third intermediate signal. The RF circuit may generate the output signal having a flattened response by providing pulse shaping in response to the control signal.

9 Claims, 4 Drawing Sheets

GAN HEMT POWER TRANSISTOR PULSE LEVELING CIRCUIT

FIELD OF THE INVENTION

The present invention relates to leveling circuits generally and, more particularly, to a method and/or apparatus for implementing a GaN HEMT power transistor pulse leveling circuit.

BACKGROUND OF THE INVENTION

Conventional test circuits for testing GaN transistors apply a constant voltage signal to the gate of the device under test sufficient to achieve a desired level of quiescent drain current. When a pulsed RF input power signal is applied to the transistor being tested, the output RF signal results in a shape that drops in magnitude as a function of pulse width and duty factor. With GaN transistors, a fast rise or peaking in magnitude at the beginning of the pulse can result, which begins to level off as compression is reached.

It would be desirable to implement a GaN HEMT power transistor pulse leveling circuit that compensates for drops in output power by adjusting the gate voltage and/or quiescent drain current and/or RF power gain at the end of a pulse as a function of time to counterbalance the drop in power inherent in conventional test circuits.

SUMMARY OF THE INVENTION

The present invention concerns an apparatus comprising an RF circuit, a converter circuit, an amplifier, and a delay circuit. The RF circuit may be configured to generate (i) an output signal and (ii) a first intermediate signal, in response to (i) an input signal and (ii) a control signal. The converter circuit may be configured to generate a second intermediate signal in response to the first intermediate signal. The amplifier may be configured to generate a third intermediate signal in response to the second intermediate signal. The delay circuit may be configured to generate the control signal in response to the third intermediate signal. The RF circuit may generate the output signal having a flattened response by providing pulse shaping in response to the control signal.

The objects, features and advantages of the present invention include providing a leveling circuit that may (i) adjust an RF gain of a device under test, (ii) provide a flattened response, (iii) provide pulse shaping, (iv) be implemented using one or more GaN HEMT power transistors, (v) maintain quiescent current at a nominal level towards the end of a pulse, (vi) reduce a gate voltage at the beginning of a pulse and/or (vii) be easy to fabricate using existing process technologies.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
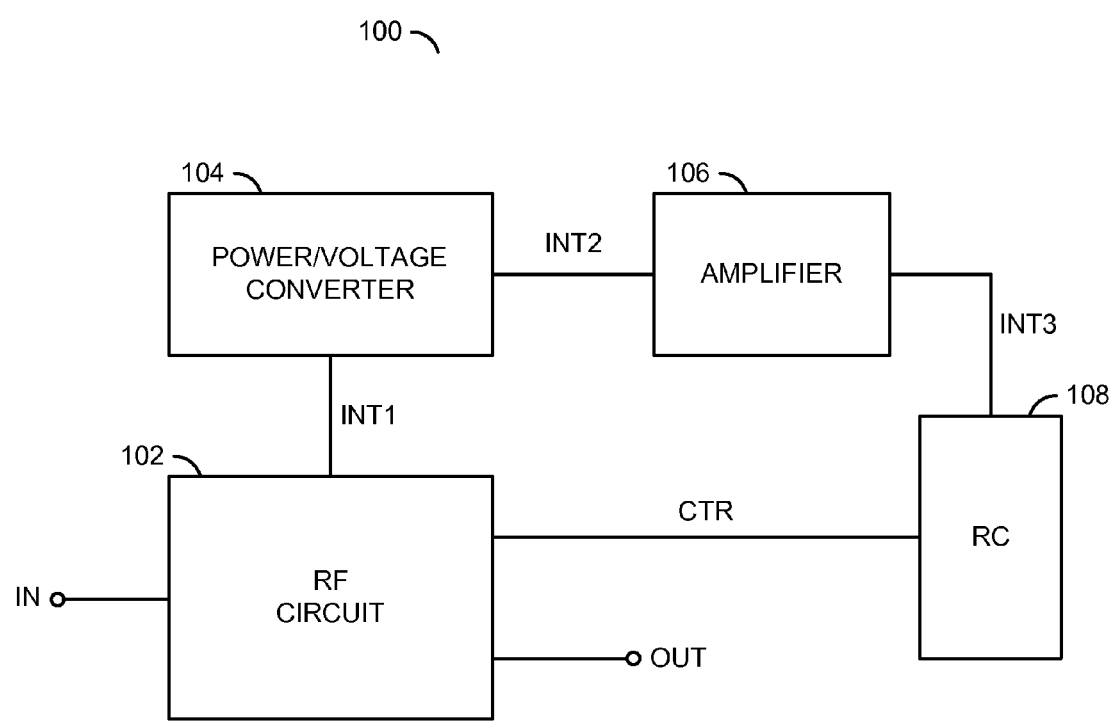
FIG. 1 is a block diagram of the present invention.

Referring to FIG. 1, a block diagram of a circuit 100 is shown in accordance with an embodiment of the present invention. The circuit 100 generally comprises a block (or circuit) 102, a block (or circuit) 104, a block (or circuit) 106 and a block (or circuit) 108. The circuit 102 may be implemented as an RF circuit. The circuit 104 may be implemented as a power/voltage converter circuit. The circuit 106 may be implemented as an amplifier circuit. The circuit 108 may be implemented as an RC delay circuit. The circuit 102 may generate a signal (e.g., OUT) in response to a signal (e.g., IN) and a signal (e.g., CTR). The circuit 102 may also present a signal (e.g., INT1). A circuit 104 may generate a signal (e.g., INT2) in response to the signal INT1. The amplifier circuit 106 may generate a signal (e.g., INT3) in response to the signal INT2. The circuit 108 may generate the signal CTR in response to the signal INT3. The circuit 108 may provide a delay that may be used by the circuit 102 to flatten the signal OUT. In one example, the circuit 106, in series with the circuit 108, may provide the signal CTR with an RC delay. The signal CTR may be used by the circuit 102 to flatten the signal OUT.

Figure 2:
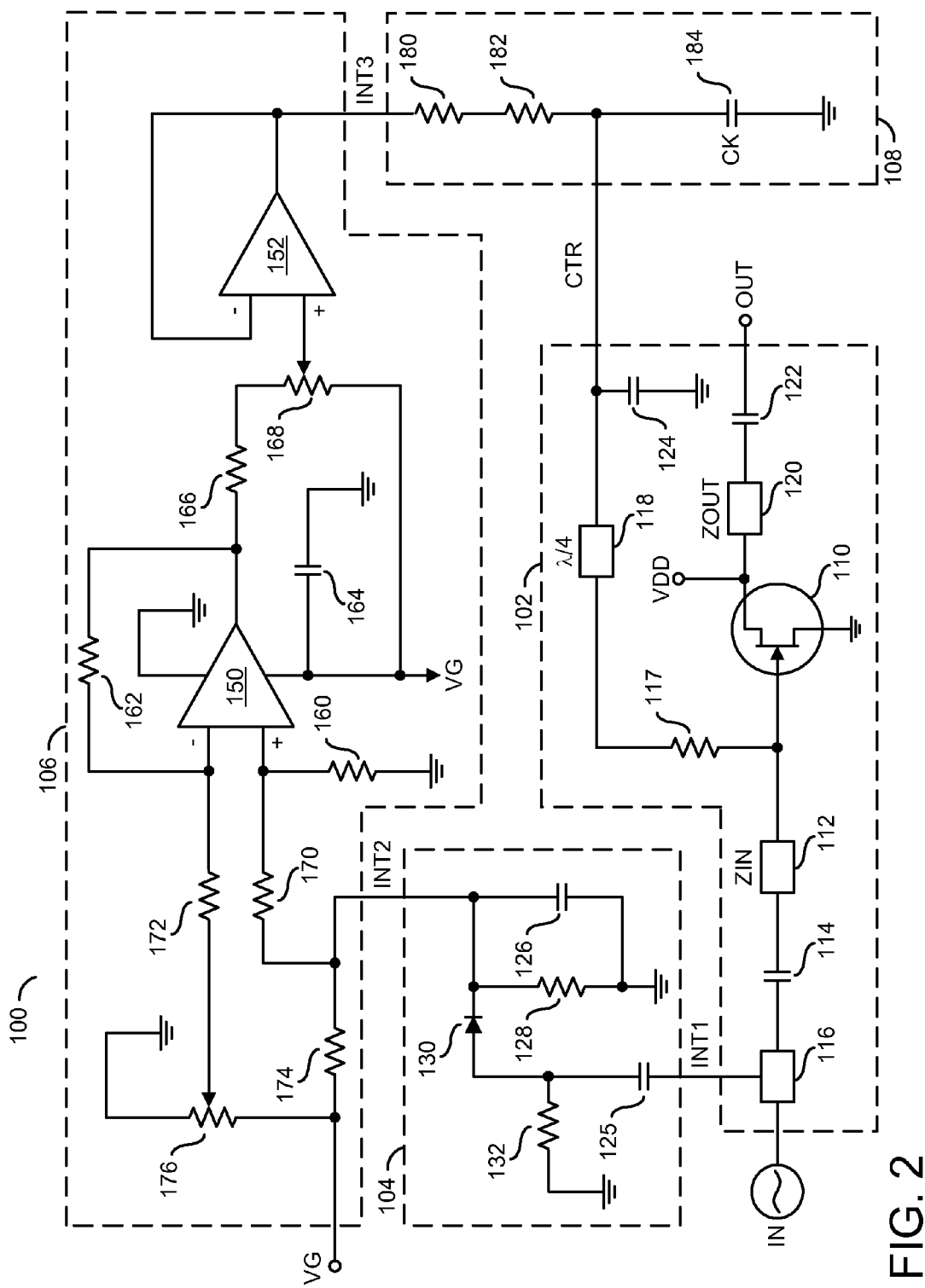
FIG. 2 is a more detailed diagram of the circuit of FIG. 1.

Referring to FIG. 2, a more detailed diagram of the circuit 100 is shown. The circuit 102 generally comprises a transistor 110, a block (or circuit) 112, a capacitor 114, a transmission line 116, a resistor 117, a block (or circuit) 118, a block (or circuit) 120, a capacitor 122, and a capacitor 124. In one example, the circuit 112 may be implemented as an input impedance matching circuit. Similarly, the circuit 120 may be implemented as an output impedance matching circuit. In one example, the circuit 118, the circuit 120 and/or the circuit 112 may be described generically as transmission lines.

The circuit 104 generally comprises a capacitor 125, a capacitor 126, a resistor 128, a diode 130, and a resistor 132. The circuit 106 generally comprises an amplifier 150 and an amplifier 152. The amplifiers 150 and 152 may be implemented as operational amplifiers. The circuit 106 may also comprise a resistor 160, a resistor 162, a capacitor 164, a resistor 166, a variable resistor 168, a resistor 170, a resistor 172, a resistor 174 and a variable resistor 176. The circuit 106 generally comprises a resistor 180, a resistor 182 and a capacitor 184.

In one example, the circuit 100 may be implemented as a power amplification/test circuit. For example, the circuit 100 may be used to test one or more GaN HEMT transistors. In one example, the circuit 102 may be configured as a power amplification circuit. The circuit 102 is shown implemented with a GaN HEMT transistor (Gallium Arsenide High Electron Mobility Transistor) as a device under test. In one example, the circuit 102 may operate as a class AB amplification circuit with a bias input (e.g., the signal CTR). In one example, the circuit 104 may be implemented as an input power signal sampler circuit. The circuit 104 may detect RF input power (e.g., on the signal INT1). The circuit 104 may generate the signal INT2 as a DC voltage. In one example, the circuit 106 may be implemented as a voltage comparator circuit. The circuit 106 may add voltage to the signal VG, in response to the signal INT2. The signal VG may be used to control the gate of the circuit 110. By modifying the level of the signal VG, the circuit 100 levels the shape of the pulses on the signal OUT. The circuit 108 may be implemented as an RC delay circuit. The circuit 108 may provide a time delay generally corresponding to a pulse width of the signal IN. The time delay may be added to the signal VG to counterbalance a potential pulse rise that may occur in the circuit 102.

The DUT 110 may be a FET transistor. The transistor 110 may operate as a power amplifier. A drain voltage is normally applied to the transistor 110 through the power supply VDD. A gate voltage is applied to the transistor through the signal VG. When the transistor 110 is sufficiently biased in Class AB mode, the transistor 110 may amplify the input signal IN to a higher magnitude to generate the signal OUT. In general, a negative gate voltage is normally applied to the transistor 110 prior to applying the drain voltage.

With the pulse leveling circuit 100, the circuit 104 may detect the signal IN and increase the gate voltage at the DUT 110 to be equal to the signal VG plus a LV during the 'on time' of the input pulse signal IN. The gate voltage may be increased as a function of time as controlled by the delay circuit 108. The time dependent voltage at the DUT 110 slowly increases the quiescent drain current and hence RF gain towards the end of the pulse. The adjustments to gain may counterbalance the drop in power that would normally occur at the signal OUT without the circuit 100. The resultant waveform of the signal OUT is a pulse signal with reduced power droop (to be described in more detail in connection with FIGS. 4a-4c).

The circuit 150 may compare the voltage from the gate bias signal VG with the voltage from the cathode of the detector diode 130. The variable resistor 176 may be adjusted so that during the 'off-time' of the input pulse signal IN, the circuit 150 rails low. At that time, the voltage applied to the gate of the transistor is equal to the signal VG. During the 'on-time' of the signal IN, the voltage at the diode 130 increases, and the circuit 150 rails 'high'. When the circuit 150 rails high, additional voltage is added to the signal VG. Thus, the voltage applied to the gate of the DUT 110 will be the signal VG+ΔV. The variable resistor 168 is used to control the magnitude of ΔV. The circuit 152 may be used as a unity gain buffer amplifier. The amplifier 152 may provide isolation and/or be used in case the DUT 110 draws current from the source.

In one example, the capacitor 114 may be implemented as a 100 pF capacitor. However, the particular value of the capacitor 114 may be varied to meet the design criteria of a particular implementation. In general, the capacitor 114 may be implemented to provide a high impedance during a DC condition. Such a high impedance may block the voltage signal IN during a DC condition. The transmission line 116 may be implemented, in one example, as a 50-Ohm transmission line. However, the particular impedance of the transmission line 116 may be varied to meet the design criteria of a particular implementation. The circuit 118 may be implemented as a quarterwave transmission line. In one example, the transmission line 118 may have a 50-Ohm impedance. However, the particular impedance may be varied to meet the design criteria of a particular implementation. In general, the transmission line 118 may be implemented having a length that is equal to a quarter of the wavelength of a fundamental frequency of the signal IN. In an alternate implementation, DC biasing may be achieved by implementing a choke (or inductor) along with a capacitor. A high value resistor may also be implemented as an alternative to quarterwave biasing. A similar biasing scheme may also be used in order to feed the voltage VDD.

The capacitor 122 may be implemented, in one example, as a 100 pF capacitor. However, the particular value of the capacitor 122 may be varied to meet the design criteria of a particular implementation. In general, the capacitor 122 may be implemented to provide a high impedance during a DC condition. Such a high impedance may block the signal IN during such a DC condition. In one example, the capacitor 124 may be implemented as a 100 pF capacitor. However, the particular value of the capacitor 124 may be varied to meet the design criteria of a particular implementation. The capacitor 124 may be implemented, in one example, as a shunt capacitor. The capacitor 124 may operate in conjunction with the transmission line 118 to provide an RF choke (e.g., attenuation) at a fundamental frequency of the signal IN.

The capacitor 125 may be implemented, in one example, as a 0.2 pF capacitor. However, the particular value of the capacitor 125 may be varied to meet the design criteria of a particular implementation. The capacitor 125 may be implemented to provide a high impedance at a fundamental frequency of the signal IN. In one example, the capacitor 125 may be replaced by a directional coupler, a gap coupler, a resistor, and/or any other device to sample the energy from the transmission line 116. The capacitor 126 may be implemented, in one example, as a 100 pF capacitor. The resistor 128 may be implemented, in one example, as a 4.2K-Ohm resistor. The particular values of the capacitor 126 and/or the resistor 128 may be varied to meet the design criteria of a particular implementation. The diode 130 may be implemented to detect an RF sampled signal. The diode 130 may rectify an AC portion of the signal INT1 by blocking a negative portion of the signal INT1. The capacitor 126 and/or resistor 128 may form a filter that normally operates on the rectified signal received from the diode 130. The capacitor 126 and/or the resistor 128 may provide a constant DC voltage. The resistor 132 may be implemented, in one example, as an 82-Ohm resistor. The resistor 132, along with the capacitor 125, may form a coupler circuit.

The circuit 150 and/or the circuit 152 may be implemented as operational amplifiers. For example, a part number LM3722M may be used to implement the amplifiers 150 and/or 152. However, the particular type of operational amplifier implemented may be varied to meet the design criteria of a particular implementation. A "threshold" voltage that may be set by the variable resistor 176 may be compared with the signal INT2. The signal VG may be an external negative voltage supplied. The variable resistor 176 may set a threshold at a point between the magnitude of the signal VG and GND (or zero).

When the signal INT2 is present (e.g., during an on-time pulse of the signal IN), the circuit 150 normally rails high. The circuit 152 may have a positive input connected to the output of the circuit 150. The circuit 152 may be implemented to set a magnitude of a voltage increase that may be controlled through the signal CTR. The resistors 160, 162, 166, 168, 170, 172, and/or 174 may be sized to meet the design criteria of a particular implementation. For example, the resistor 160 may be implemented as a 100K-Ohm resistor. The resistor 162 may be implemented as a 1M-Ohm resistor. The resistor 166 may be implemented as a 500-Ohm resistor. The resistor 170 and/or the resistor 172 may be implemented as 1K-Ohm resistors. The resistor 174 may be implemented as a 24K-Ohm resistor. The variable resistor 168 may be implemented as a 0-5K-Ohm variable resistor. The variable resistor 176 may also be implemented as a 0-5K-Ohm resistor. In an alternate implementation, the variable resistors 168 and/or 172 may be implemented by resistive voltage dividers. In another example, the variable resistors 168 and/or 176 may be implemented as digital potentiometers. The capacitor 164 may be implemented, in one example, as a 0.1 uF capacitor. While the resistor 168 and the resistor 176 are shown as variable resistors, fixed resistors may also be implemented.

The resistor 180 may be implemented, in one example, as a 10-Ohm resistor. The resistor 182 may be implemented, in one example, as a 75-Ohm resistor. The capacitor 184 may be implemented, in one example, as a 1.0 uF capacitor. However, the particular values of the resistor 180, the resistor 182 and/or the capacitor 184 may be varied to meet the design criteria in the particular implementation. The resistor 180, the resistor 182 and the capacitor 184 may implement an RC network that may implement a time delay. The resistor 180 and the resistor 182 may be implemented, in one example, as discrete elements. However, the resistor 180 and/or the resistor 182 may also be implemented as one resistor having a higher value. The particular implementation of the resistor 180 and/or 182 may be varied to meet the design criteria of a particular implementation. For example, particular design tools may make it more convenient (or less convenient) to implement the resistor 180 and/or the resistor 182 as separate components.

The circuit 100 may operate by applying a DC voltage (e.g., VG) which may be applied to a gate of the DUT 110. A signal (e.g., VDD) may be applied to the drain of the DUT 110. In one example, the signal VDD may be a +50V signal. The signal VG may be adjusted so that approximately 100 mA of quiescent drain bias current is drawn from the supply VDD.

The signal IN may be a pulsed RF input signal that may be applied to the circuit 100. A small portion of the signal IN may be detected at the diode 130. The diode 130 may be implemented to increase the voltage at the comparator amplifier 150. As a result, an additional positive voltage may be added to the gate of the DUT circuit 110 at the beginning of a pulse on the signal IN.

The RC circuit 108 may be connected in series with the operational amplifier comparator circuit 106. The RC circuit 108 may apply a delay to the added gate voltage. The added gate voltage (and corresponding RF gain of the transistor), may increase as a function of time.

Figure 3:
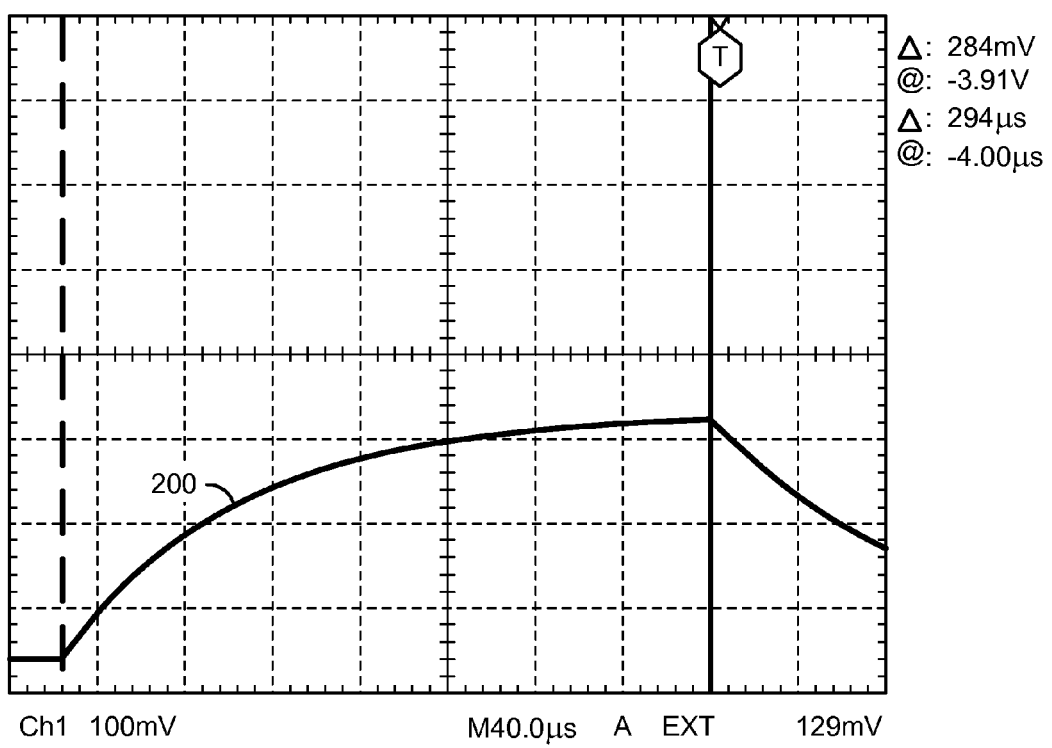
FIG. 3 is a waveform of a voltage applied to a gate of a device under test.

Referring to FIG. 3, a pulse waveform 200 of a voltage applied to a gate of the circuit 110 is shown. The waveform shows the node that connects Zin (112) and the 10-Ohm resistor (117)-VGS. The waveform 200 illustrates how the gate voltage is increased from around −3.9V to around −3.6V over the length of the pulse width. An increased RF gain toward the end of the pulse waveform 200 normally counteracts the effects of the pulse droop that would normally occur when the device 110 is operating under normal pulsed RF operating conditions. The resultant output signal OUT of the circuit 100 normally yields lower pulse droop compared to the performance in the uncompensated circuit.

Figure 4:
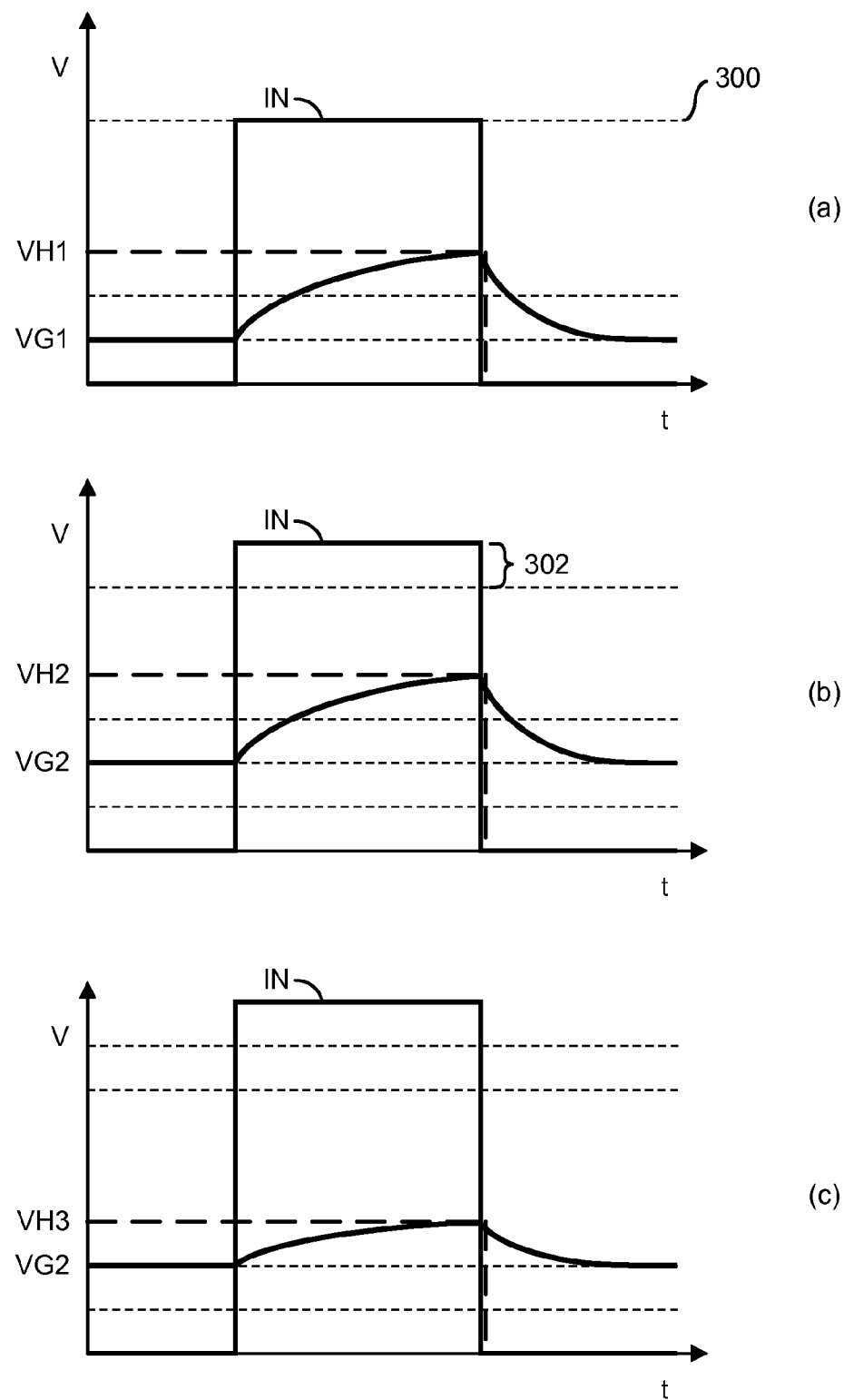
FIGS. 4a-4c illustrate waveforms of various input signals and output signals.

Referring to FIGS. 4a-4c, a number of waveform diagrams are shown. In general, the signal VG may be shifted up or down by varying the strength of the supply voltage. The signal VH may be shifted up or down by adjusting the trim resistor 168. In general, the signal VH may be dependent on the magnitude of the signal VG. If the signal VG is set to a new level, the signal VH may need to be readjusted (or recalibrated). Such a calibration may be implemented as a post-production calibration. For example, such a calibration may be set in one or more tests prior to taking final data. In a more sophisticated implementation, digital potentiometers may be used (e.g., via automated test equipment). In general, the signal VG may be implemented as a negative supply to the operational amplifier 150. A positive supply for the operational amplifier 150 may be grounded through the variable resistor 172 and/or the variable resistor 176. In this case, the positive power supply line of the operational amplifier 150 is normally connected to ground or zero while the negative side is connected to the signal VG. The operational amplifier 150 may have an output that rails between the signal VG and 0. The operational amplifier 152 may have an output that may rail between the signal VG and the signal VH. The signal VG may be implemented to be always negative and/or to have a maximum level that may be determined by the specifications of the operational amplifiers 150 and/or 152.

In FIG. 4a, a diagram of an initial setting is shown. The pulse signal IN is shown having an initial level 300. The signal VG1 is shown having a bottom portion at a level VG1 and a top portion at a level VH1. In the FIG. 4b, the level VG is shifted up one unit. The level VH2 is shifted up as well. The shifting of the signal VH2 essentially occurs automatically in response to the shifting of the level of signal VG. The signal IN is shifted by an amount shown as 302. The RF input signal does not necessarily need to change, but the level of the signal CTR does need to change. The RF input signal is shown for timing purposes, rather than for magnitude purposes. The dependence of the signal VH on the signal VG is not necessary in all designs. However, such a dependence may simplify the overall circuitry implemented. The particular magnitude of the signal IN may vary, while still maintaining the range of the output. For example, the signal IN may vary by as much as 10 dB (or more) depending on the design criteria of a particular implementation. In the FIG. 4c, the level VH is adjusted back down one unit based on the trim resistor 168. Therefore, the output waveform has a level between VG2 and VH3.

It will be apparent to those skilled in the relevant art(s) that certain nodes of transistors and other semiconductor devices may be interchanged and still achieve some desired electrical characteristics. The node interchanging may be achieved physically and/or electrically. Examples of transistor nodes that may be interchanged include, but are not limited to, the emitter and collector of bipolar transistors, the drain and source of field effect transistors, and the first base and second base of unijunction transistors.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   an RF circuit configured to generate (i) an output signal and (ii) a first intermediate signal, in response to (i) an input signal and (ii) a control signal;
   a converter circuit configured to generate a second intermediate signal in response to said first intermediate signal;
   an amplifier configured to generate a third intermediate signal in response to the second intermediate signal; and
   an RC delay circuit configured to generate said control signal in response to the third intermediate signal, wherein said RF circuit generates said output signal having a flattened response by providing pulse shaping in response to said control signal.

2. The apparatus according to claim 1, wherein said RC delay circuit comprises a first resistor, a second resistor, and a capacitor, wherein said first resistor and said second resistor are sized to create said flattened response of said output signal.

3. The apparatus according to claim 1, wherein said amplifier comprises a first operational amplifier and a second operational amplifier.

4. The apparatus according to claim 3, wherein said first operational amplifier increases a gate voltage of a device under test.

5. The apparatus according to claim 3, wherein said second operational amplifier buffers current to provide isolation.

6. The apparatus according to claim 1, wherein said RF circuit comprises an RF matching circuit configured to test a GaN HEMT power transistor.

7. The apparatus according to claim 1, wherein said RC delay circuit comprises one or more resistors and one or more capacitors.

8. An apparatus comprising:
   means for generating (i) an output signal and (ii) a first intermediate signal, in response to (i) an input signal and (ii) a control signal;
   means for generating a second intermediate signal in response to said first intermediate signal;
   means for generating a third intermediate signal in response to the second intermediate signal; and
   means for generating said control signal using an RC delay circuit in response to the third intermediate signal, wherein said apparatus generates said output signal having a flattened response by providing pulse shaping in response to said control signal.

9. A method for leveling pulses in a signal generated by a GaN HEMT power transistor, comprising the steps of:
   (A) generating (i) an output signal and (ii) a first intermediate signal, in response to (i) an input signal and (ii) a control signal;
   (B) generating a second intermediate signal in response to said first intermediate signal;
   (C) generating a third intermediate signal in response to the second intermediate signal; and
   (D) generating said control signal in response to the third intermediate signal using an RC delay circuit, wherein said method generates said output signal having a flattened response by providing pulse shaping in response to said control signal.

* * * * *